United States Patent [19]

Boettcher

[11] 4,216,386

[45] Aug. 5, 1980

[54] CHARGE COUPLED DEVICE WITH REDUCED POWER CONSUMPTION UPON CHARGE TRANSFER

[75] Inventor: Charles E. Boettcher, Sandy, Utah

[73] Assignee: National Semiconductor Corporation, Santa Clara, Calif.

[21] Appl. No.: 5,994

[22] Filed: Jan. 24, 1979

[51] Int. Cl.² .................. G11C 19/28; H01L 29/78
[52] U.S. Cl. .................. 307/221 D; 357/24
[58] Field of Search .............. 357/24; 307/221 D

[56] References Cited

U.S. PATENT DOCUMENTS 3,987,312  10/1976  Ablassmeier ..................... 357/24

OTHER PUBLICATIONS

Sequin et al. *Charge Transfer Devices* Academic Press, N.Y. (1975) Chapter 3.

*Primary Examiner*—Gene M. Munson
*Attorney, Agent, or Firm*—Brown & Martin

[57] ABSTRACT

A charge coupled device is controlled to conserve energy during charge transfer. By connecting the storage electrode corresponding to the substrate region in which a charge packet is stored to an adjacent electrode, the potential at the storage electrode is reduced and the potential on the adjacent electrode is increased to a level where charge transfer is initiated to transfer a portion of the charge packet to the substrate region corresponding to the next adjacent storage electrode.

5 Claims, 14 Drawing Figures

CHARGE COUPLED DEVICE WITH REDUCED POWER CONSUMPTION UPON CHARGE TRANSFER

BACKGROUND OF THE INVENTION

The present invention generally pertains to charge coupled devices and is particularly directed to an improvement in conserving energy during charge transfer.

A typical prior art charge coupled device (CCD) includes a semiconductor substrate; a source diffusion in the substrate; a drain diffusion in the substrate; an insulating dielectric layer covering the substrate; and a serial array of electrodes defining a serial array of corresponding gates in the dielectric layer extending from the region adjacent the source to the region adjacent the drain, wherein alternate electrodes are transfer electrodes and storage electrodes respectively. Driver circuits are connected to the electrodes to control the transfer of charge packets through the device.

The driver circuits include a plurality of transfer gate driver circuits connected to the transfer electrodes for selectively placing first control signals on their corresponding transfer gates to condition their respective corresponding semiconductor substrate regions for enabling a charge packet to be transferred in the substrate between those regions beneath the gates corresponding to the adjacent storage electrodes when the first control signal placed on the intervening transfer gate is of at least a transfer potential; and a plurality of storage gate driver circuits connected to the storage electrodes for selectively placing second control signals on their corresponding storage gates to condition their respective corresponding semiconductor substrate regions for enabling a charge packet to be stored in selected substrate regions when the second control signal is of at least a storage potential.

A typical prior art four-phase CCD includes four driver circuits.

A first driver circuit is connected to a series of first transfer electrodes consisting of every other transfer electrode beginning with the first transfer electrode in the serial array, for placing a first control signal on their corresponding first transfer gates to condition their corresponding semiconductor substrate regions for enabling charge packets to be transferred in the substrate between those regions beneath the gates corresponding to the adjacent storage electrodes when the first control signal is of at least a transfer potential.

A second driver circuit is connected to a series of first storage electrodes consisting of every other storage electrode beginning with the second electrode in the serial array, for placing a second control signal on their corresponding first storage gates to condition their corresponding semiconductor substrate regions for enabling charge packets to be stored in the substrate regions beneath the first storage gates when the second control signal is of at least a storage potential.

A third driver circuit is connected to a series of second transfer electrodes consisting of every other transfer electrode beginning with the third electrode in the serial array, for placing a third control signal on their corresponding second transfer gates to condition their corresponding semiconductor substrate regions for enabling charge packets to be transferred in the substrate between those regions beneath the gates corresponding to the adjacent storage electrodes when the third control signal is of at least a transfer potential.

Finally, a fourth driver circuit is connected to a series of second storage electrodes consisting of every other storage electrode beginning with the fourth electrode in the serial array, for placing a fourth control signal on their corresponding second storage gates to condition their corresponding semiconductor substrate regions for enabling charge packets to be stored in the substrate regions beneath the second storage gates when the fourth control signal is of at least a storage potential.

Typically charge is injected in the CCD at its source. However, in some CCD's the source and/or the drain are eliminated and charge is generated through other means, such as photoelectrically.

The operation of a prior art CCD in transferring charge is discussed with reference to FIGS. 1A and 1B. FIG. 1A shows the potential wells defined in the semiconductor substrate regions beneath the gates corresponding to the respective transfer electrodes T1, T2 and storage electrodes S1, S2 by the application of control signals to the electrodes during five successive intervals of operation A, B, C, D and E. FIG. 1B shows the potential at the electrodes T1, S1, T2, S2 during the intervals A, B, C, D and E.

During a first interval "A", a control signal $\phi 2$ at the storage potential $V_s$ is applied to the first storage electrode S1, and control signals $\phi 1$, $\phi 3$ and $\phi 4$ all being at a rest potential "0" are applied to the first and second transfer electrodes T1, T2 and the second storage electrode S2 respectively. A charge packet 10 is stored in the substrate in a potential well 12 in the region beneath the first storage gate $G_{S1}$ corresponding to the first storage electrode S1.

During the next interval "B", the control signal $\phi 4$ is changed to apply a storage potential $V_s$ to the second storage electrode S2, and thereby define a potential well 14 in the substrate region beneath the second storage gate $G_{S2}$ corresponding to the second storage electrode S2.

During the next interval "C", the control signal $\phi 3$ is changed to apply a transfer potential $V_T$ to the second transfer electrode T2, thereby causing a potential well 16 to be defined in the substrate extending from beneath the first storage gate $G_{S1}$ to beneath the second storage gate $G_{S2}$. As a result, the charge packet begins to transfer from beneath the first storage gate $G_{S1}$.

During the following interval "D", the control signal $\phi 2$ is returned to rest potential, and the charge packet is transferred within the potential well 18 beneath the second transfer gate $G_{T2}$ and the second storage gate $G_{S2}$.

Finally during the interval "E" the control signal $\phi 3$ is returned to rest and the charge packet 10 is stored in the potential well 14 beneath the second storage gate $G_{S2}$.

The power consumed in transferring the charge packet 10 from the potential well 12 to the potential well 14 is the total of:

$$PWR = [C_{S1}(\Delta V_{\phi 2})^2 + C_{T2}(\Delta V_{\phi 3})^2] \times f \qquad \text{(Equation 1)}$$

wherein f is the frequency of the control signals $\phi 1$, $\phi 2$, $\phi 3$ and $\phi 4$; $C_{S1}$ and $C_{T2}$ are the capacitances at the electrodes S1 and T2 respectively, and $\Delta V_{\phi 2}$ and $\Delta V_{\phi 3}$ are the voltage transitions of the control signals $\phi 2$ and $\phi 3$ respectively. The capacitances involved are relatively large and therefore the power can be large for high frequency operation.

It is an object of the present invention to provide a charge coupled device which can transfer charge with less energy consumption.

SUMMARY OF THE INVENTION

The present invention provides a charge coupled device that is characterized by a circuit connected to the driver circuits for connecting a given storage electrode in the serial array corresponding to the substrate region from which a charge packet is to be transferred to an adjacent electrode corresponding to an uncharged substrate region to initiate transfer of the charge packet from the substrate region corresponding to the given storage electrode. In some preferred embodiments of the present invention the "adjacent electrode" is an adjacent transfer electrode; whereas in other preferred embodiments, the "adjacent electrode" is an adjacent storage electrode. The term "uncharged substrate region" refers to a region beneath a transfer gate which is less than the transfer potential for those embodiments wherein the adjacent electrode is a transfer electrode, and refers to a region beneath a storage gate which is less than the storage potential for those embodiments wherein the adjacent electrode is a storage electrode.

By using part of the energy used for storing the charge packet during the initiation of the transfer of the charge packet, less energy is consumed by the CCD during the charge transfer operation.

Equations for the power consumed in a four-phase CCD in accordance with the present invention are set forth hereinafter in relation to the description of a preferred embodiment thereof.

DESCRIPTION OF THE PREFERRED EMBODIMENTS

Figure 1A:
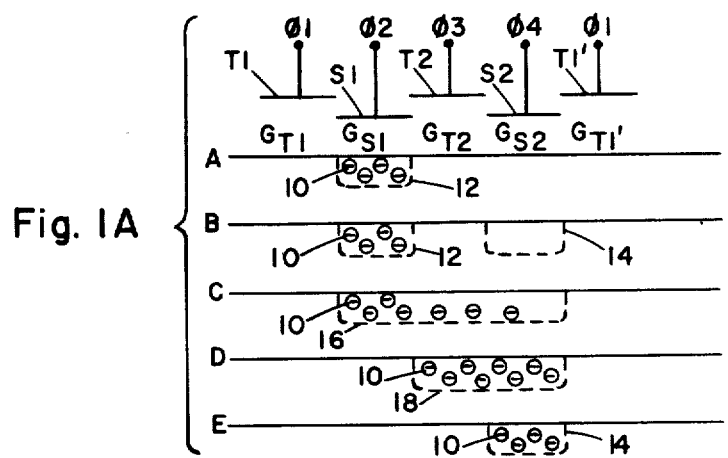
FIG. 1A shows the transfer of charge packets in a prior art four-phase CCD during different intervals of the charge transfer operation.
Figure 1B:
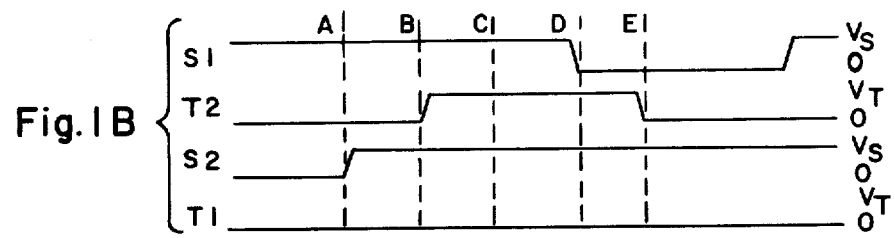
FIG. 1B shows the potential at the various electrodes of the CCD shown in FIG. 1A during the different transfer intervals.
Figure 2:
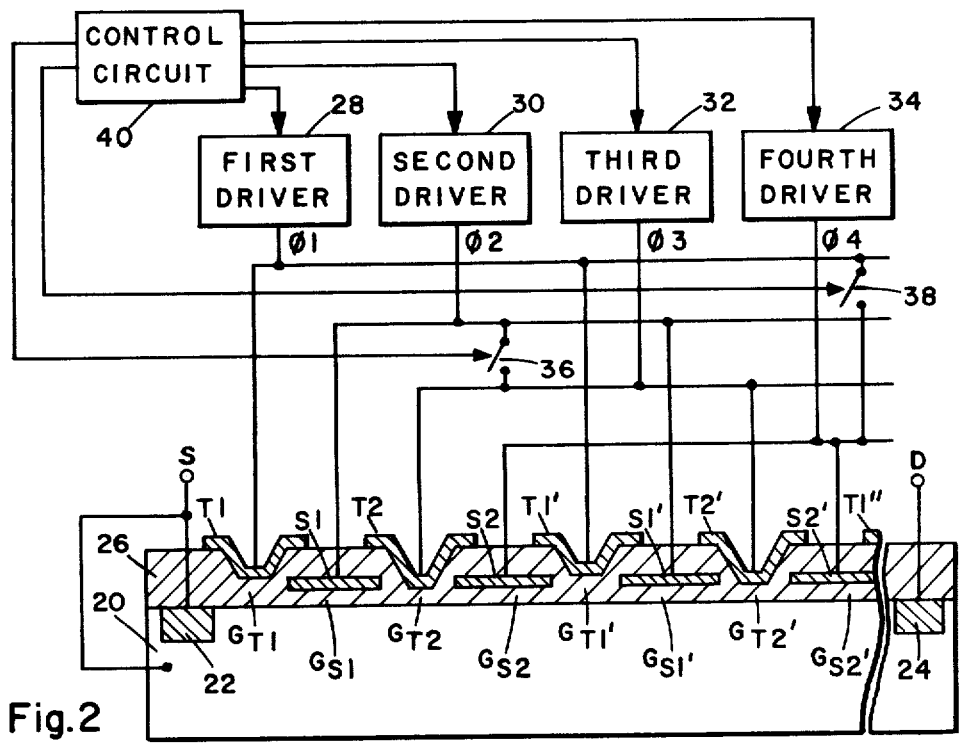
FIG. 2 is a partial block and schematic diagram of a four-phase CCD according to the present invention.

Referring to FIG. 2, a four-phase charge coupled device according to the present invention includes a semiconductor substrate 20; a source diffusion 22 in the substrate 20; a drain diffusion 24 in the substrate 20; and insulating dielectric layer 26 covering the substrate 20; a serial array of electrodes T1, S1, T2, S2, S1', T2', S2', T1" . . . within the insulating dielectric layer 26; a first driver circuit 28; a second driver circuit 30; a third driver circuit 32; a fourth driver circuit 34; a first switch 36; a second switch 38; and a control circuit 40.

This CCD has a three level electrode structure, in accordance with the teaching of a patent application by Darrell Miller Erb, entitled "Charge Coupled Device Having A Three Level Electrode Structure", filed Jan. 24, 1979, Ser. No. 5995, the disclosure of which is incorporated herein by reference thereto.

The electrodes of the CCD of FIG. 2 define a serial array of corresponding gates in the insulating dielectric layer 26 extending from the region adjacent the source 22 to the region adjacent the drain 24. Alternate electrodes are transfer electrodes T1, T2, T1', T2', T1" . . . , and storage electrodes S1, S2, S1', S2' . . . , respectively.

The first driver circuit 28 is connected to a series of first transfer electrodes T1, T1', T1" . . . consisting of every other transfer electrode beginning with the first transfer electrode T1 in the serial array closest to the source 22, for placing a first control signal $\phi 1$ on the first transfer gates $G_{T1}$, $G_{T2}$, . . . to condition their corresponding semiconductor substrate regions for enabling charge packets to be transferred in the substrate 20 between those regions beneath the gates corresponding to the adjacent storage electrodes when the first control signal is of at least a transfer potential $V_T$.

The second driver circuit 30 is connected to a series of first storage electrodes S1, S1' . . . consisting of every other storage electrode beginning with the second electrode S1 in the serial array, for placing a second control signal $\phi 2$ on the first storage gates $G_{S1}$, $G_{S2'}$, . . . to condition their corresponding first semiconductor substrate regions for enabling charge packets to be stored in the substrate regions beneath the first storage gates when the second control signal is of at least a storage potential $V_S$.

The third driver circuit 32 is connected to a series of second transfer electrodes T2, T2' . . . consisting of every other transfer electrode beginning with the third electrode T2 in the serial array, for placing a third control signal $\phi 3$ on the second transfer gates $G_{T2}$, $G_{T2'}$, . . . to condition their corresponding semiconductor substrate regions for enabling charge packets to be transferred in the substrate 20 between those regions beneath the gates corresponding to the adjacent storage electrodes when the third control signal is of at least the transfer potential $V_T$.

The fourth driver circuit 34 is connected to a series of second storage electrodes S2, S2' . . . consisting of every other storage electrode beginning with the fourth electrode S2 in the serial array, for placing a fourth control signal $\phi 4$ on the second storage gates $G_{S2}$, $G_{S2'}$, ... to condition their corresponding semiconductor substrate regions for enabling charge packets to be stored in the substrate regions beneath the second storage gates when the fourth control signal is of at least the storage potential $V_S$.

The electrodes T1, S1, T2, S2 ... are so disposed in the oxide that the transfer potential $V_T$ is less than the storage potential $V_S$.

The first switch 36 is adapted for connecting the first storage electrodes S1, S1' ... to the second transfer electrodes T2, T2' ...

The second switch 38 is adapted for connecting the second storage electrodes S2, S2' ... to the first transfer electrodes T1', T1'' ...

Figure 3A:
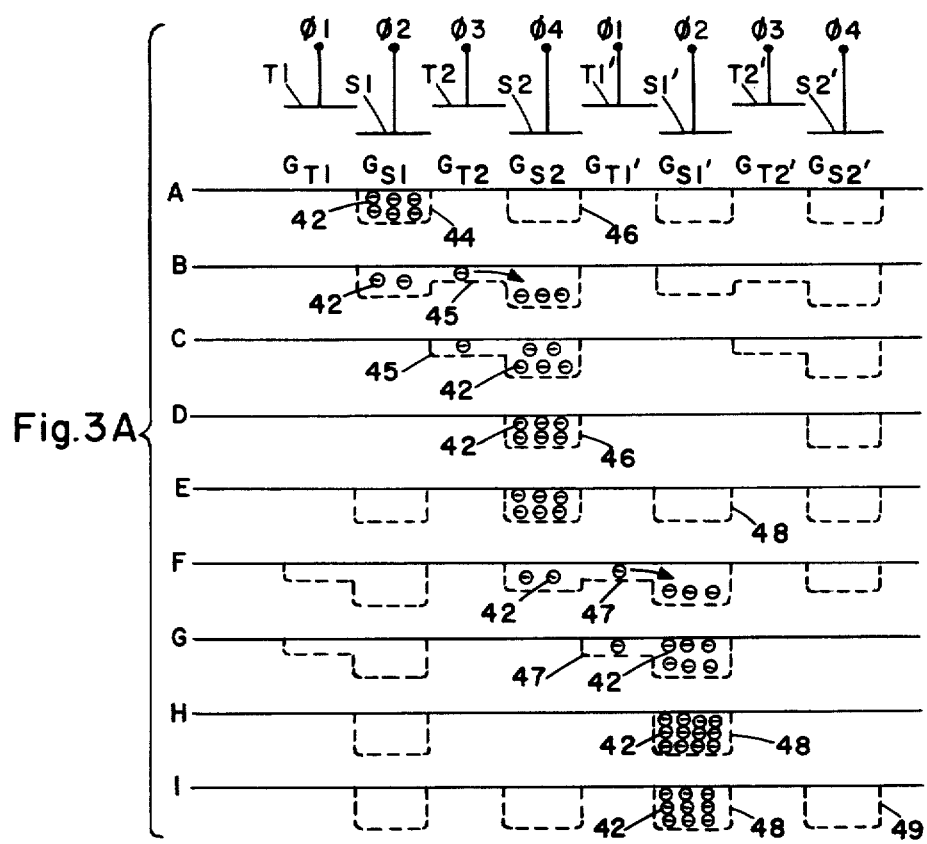
FIG. 3A shows the transfer of charge packets in the four-phase untied electrode CCD of FIG. 2 during different intervals of the charge transfer operation.

The control circuit 40 is connected to the driver circuits 28, 30, 32, 34 and to the switches 36 and 38 for controlling the transfer of charge within the CCD of FIG. 2. The sequence of such control during successive intervals is described with reference to FIGS. 3A and 3B.

During a first interval "A", the control circuit 40 causes the first control signal $\phi 1$ at the first transfer electrodes T1, T1' to be at a rest potential "0"; the second control signal $\phi 2$ at the first storage electrodes S1, S1' to be at the storage potential $V_S$; the third control signal $\phi 3$ at the second transfer electrodes T2, T2' to be at a rest potential; and the fourth control signal $\phi 4$ at the second storage electrodes S2, S2' to be at the storage potential $V_S$. During this first interval a charge packet 42 is stored in the potential well region 44 beneath the first storage gate $G_{S1}$, and an empty potential well 46 is present in the region beneath the second storage gate $G_{S2}$.

During the next interval "B", the control circuit 40 causes the first control signal $\phi 1$ at the transfer electrode T1, T1' to remain at rest potential; and causes the first switch 36 to connect the first storage electrodes S1, S1' ... to the second transfer electrodes T2, T2' ... to provide the transfer potential $V_T$ at the first storage electrodes S1, S1' ... and at the second transfer electrodes T2, T2' ... whereby a portion of the charge packet 42 stored beneath the first storage gate $G_{S1}$ is transferred through the region beneath the adjacent second transfer gate $G_{T2}$ to the region beneath the second storage gate $G_{S2}$. The control circuit 40 causes the fourth control signal $\phi 4$ at the second storage electrodes S2, S2' to remain at storage potential $V_S$ during the second interval "B".

During the third interval "C", the control circuit 40 causes the first control signal $\phi 1$ at the first transfer electrodes T1, T1' to remain at rest potential; causes the first switch 36 to disconnect the first storage electrodes S1, S1' ... from the second transfer electrodes T2, T2' ... ; causes the second control signal $\phi 2$ at the first storage electrodes S1, S1' to be at a rest potential; causes the third control signal $\phi 3$ at the second transfer electrodes T2, T2' to be at the transfer potential $V_T$; and causes the fourth control signal $\phi 4$ at the second storage electrodes S2, S2' to be at the storage potential $V_S$, whereby the remaining charge in the charge packet 42 is transferred to the region 46 beneath the second storage gate $G_{S2}$ and the region 45 beneath the adjacent second transfer gate $G_{T2}$.

During the fourth interval "D", the control circuit 40 causes the first control signal $\phi 1$ at the first transfer electrodes T1, T1' ... to remain at rest potential, the second control signal $\phi 2$ at the first storage electrodes S1, S1' to remain at rest potential, the third control signal $\phi 3$ at the second transfer electrodes T2, T2' to return to rest potential, and the fourth control signal $\phi 4$ at the second storage electrodes S2, S2' to remain at storage potential $V_S$ to complete the transfer and store the charge packet 42 in the potential well region 46 beneath the second storage gate $G_{S2}$.

During the fifth interval "E", the control circuit 40 causes the first control signal $\phi 1$ at the first transfer electrodes T1, T1' to remain at rest potential; the second control signal $\phi 2$ at the first storage electrodes S1, S1' to return to storage potential $V_S$; the third control signal $\phi 3$ at the second transfer electrodes T2, T2' to remain at rest potential and the fourth control signal $\phi 4$ at the second storage electrodes S2, S2' to remain at storage potential $V_S$. During the fifth interval "E", the charge packet 42 is stored in the region 46 beneath the second storage gate $G_{S2}$, and an empty potential well 48 is created in the region beneath the first storage gate $G_{S1'}$.

During the sixth interval "F", the control circuit 40 causes the second switch 38 to connect the second storage electrodes S2, S2' ... to the first transfer electrodes T1', T1'' ... to provide the transfer potential $V_T$ at the second storage electrodes S2, S2'' ... , and at the first transfer electrodes T1', T1'' ... , whereby a portion of the charge packet 42 stored in the region beneath the second storage gate $G_{S2}$ is transferred through the region beneath the adjacent first transfer gate $G_{T1'}$ to the region beneath the first storage gate $G_{S1'}$. The control circuit 40 also causes the second control signal $\phi 2$ at the first storage electrodes S1, S1' to remain at storage potential $V_S$, and the third control signal $\phi 3$ at the second electrodes T2, T2' to remain at rest potential during the sixth interval "F".

During the seventh interval "G", the control circuit 40 causes the second switch 38 to disconnect the second storage electrodes S2, S2' ... from the first transfer electrodes T1', T1'' ... , causes the first control signal $\phi 1$ at the first transfer electrodes T1, T1' to be at the transfer potential $V_T$, causes the second control signal $\phi 2$ at the first storage electrodes S1, S1' to be at the storage potential $V_S$, causes the third control signal $\phi 3$ at the second transfer electrodes T2, T2' to be at rest potential, and causes the fourth control signal $\phi 4$ at the second storage electrodes S2, S2' to be at a rest potential, whereby the remaining charge in the charge packet 42 is transferred to the region 48 beneath the first storage gate $G_{S1}$, and the region 47 beneath the adjacent first transfer gate $G_{T1'}$.

During the eighth interval "H", the control circuit 40 causes the first control signal $\phi 1$ at the first transfer electrodes T1, T1' to return to rest potential, the second control signal $\phi 2$ at the first storage electrodes S1, S1' to remain at the storage potential $V_S$ to complete the transfer and store the charge packet 42 in the potential well region 48 beneath the adjacent first storage gate $G_{S1}$; the third control signal $\phi 3$ at the second transfer electrodes T2, T2' to remain at rest potential and the fourth control signal $\phi 4$ at the second storage electrodes S2, S2' to remain at rest potential.

During the ninth interval "I", the control circuit 40 causes the first control signal $\phi 1$ at the first transfer electrodes T1, T1' to be at rest potential, the second control signal $\phi 2$ at the first storage electrodes S1, S1, to be at the storage potential $V_S$, the third control signal ϕ3 at the second transfer electrodes T2, T2' to be at rest potential, and the fourth control signal ϕ4 at the second storage electrodes S2, S2' to return to the storage potential $V_S$. During the ninth interval "I", the charge packet 42 is stored in the region 48 beneath the adjacent first storage gate $G_{S1'}$, and an empty potential well is created in the region 49 beneath the second storage gate $G_{S2'}$.

During the succession of nine intervals described above, a charge packet 42 is transferred from the region 44 beneath the first storage gate $G_{S1}$ to the region 46 beneath the second storage gate $G_{S2}$, and then to the region 48 beneath the adjacent first storage gate $G_{S1'}$, in the direction away from the source 22.

In summary, the control circuit 40 and the switches 36 and 38 are connected to the driver circuits 28, 30, 32, 34 for connecting the first storage electrodes S1, S1' to the second transfer electrodes T2, T2' when the first storage gates $G_{S1}$, $G_{S1'}$ are at the storage potential to provide the transfer potential at the second transfer gates $G_{T2}$, $G_{T2'}$, whereby a portion of a charge packet 42 stored in the region 44 beneath the first storage gate $G_{S1}$ is transferred through the region 45 beneath the adjacent second transfer gate $G_{T2}$ to the region 46 beneath the adjacent second storage gate $G_{S2}$; and for then disconnecting the first storage electrodes S1, S1' from the second transfer electrodes T2, T2', and causing the first storage gates $G_{S1}$, $G_{S1'}$ to be at a rest potential while the second storage gates $G_{S2}$, $G_{S2'}$ are at the storage potential, whereby the charge packet is stored in the region 46 beneath the second storage gate $G_{S2}$; and for connecting the second storage electrodes S2, S2' to the first transfer electrodes T1, T1' when the second storage gates $G_{S2}$, $G_{S2'}$ are at the storage potential to provide the transfer potential at the first transfer gates $G_{T1}$, $G_{T1'}$ whereby a portion of a charge packet stored in the region 46 beneath the second storage gate $G_{S2}$ is transferred through the region 47 beneath the adjacent first transfer gate $G_{T1'}$ to the region 48 beneath the adjacent first storage gate $G_{S1'}$; and for then disconnecting the second storage electrodes S2, S2' from the first transfer electrodes T1, T1', and causing the second storage gates $G_{S2}$, $G_{S2'}$ to be at rest potential while the first storage gates $G_{S1}$, $G_{S1'}$ are at the storage potential, whereby the charge packet is stored in the region 48 beneath the first storage gate $G_{S1'}$ adjacent the adjacent first transfer gate $G_{T1'}$.

The energy consumed in transferring the charge packet from the region 42 to the region 44 is only the energy dissipated in initially charging the capacitance $C_{S1}$ defined by the first storage electrode S1.

$$PWR = C_{S1}(\Delta V_{\phi 2})^2 \times f \qquad \text{(Equation 2)}$$

which is less than the power consumed in the prior art device, as expressed by Equation 1.

Figure 3B:
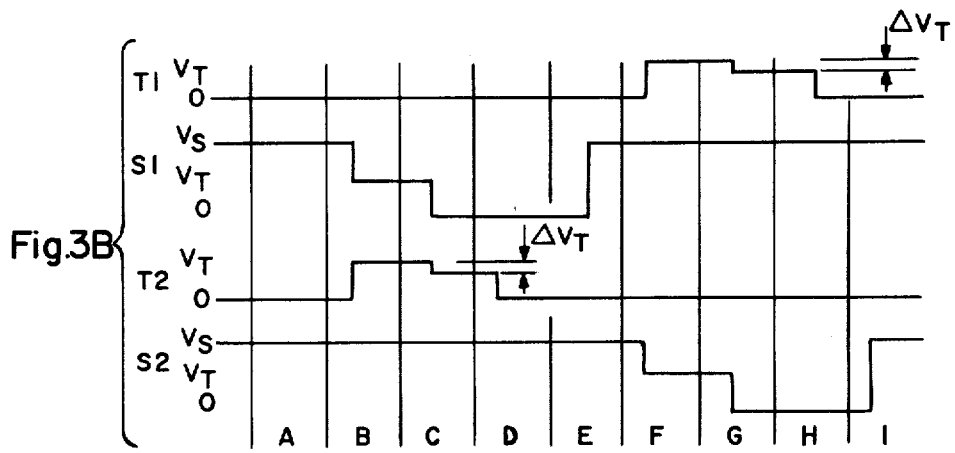
FIG. 3B shows the potential at the various electrodes of the CCD of FIG. 2 during the different transfer intervals.

Referring to FIG. 3B it should be noted that there is a small charge $\Delta V_T$ in the voltage on the transfer electrodes T2, T1', when the control signals ϕ2 and ϕ4 applied to the adjacent storage electrodes S1 and S2 respectively are taken to rest potential (during intervals D and H respectively). This is caused by capacitive coupling between the adjacent pairs of electrodes S1 and S2 and T2 and T1' respectively; and the value of this voltage change $\Delta V_T$ is expressed by Equation 3:

$$\Delta V_T = V_T(C_C/C_T) \qquad \text{(Equation 3)}$$

where $C_C$ is mutual coupling capacitance between the adjacent electrodes S1 and T2, S2 and T1', and $C_T$ is the capacitance of the respective transfer electrode T2, T1'.

The ratio of $C_C$ to $C_T$ can be controlled to the extent that this voltage change $\Delta V_T$ will not pose a serious problem to the completion of charge transfer.

The present invention is also applicable to CCD's not including a source and a drain, wherein the charge is generated by other means, such as photoelectrically.

The CCD of the present invention is particularly useful in memory devices containing parallel serial arrays of electrodes.

Figure 4:
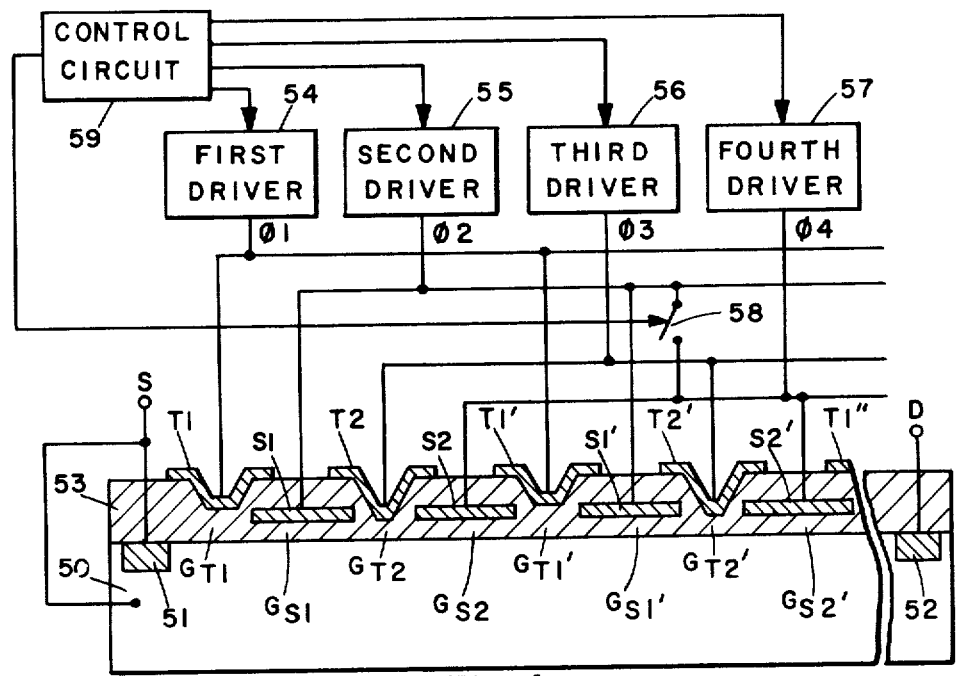
FIG. 4 is a partial block and schematic diagram of another four-phase untied electrode CCD according to the present invention.

Referring to FIG. 4, another embodiment of a four-phase charge-coupled device according to the present invention includes a semiconductor substrate 50; a source diffusion 51 in the substrate 50; a drain diffusion 52 in the substrate 50; an insulating dielectric layer 53 covering the substrate 50; a serial array of electrodes T1, S1, T2, S2, S1', T2', S2', T1" . . . within the insulating dielectric layer 53; a first driver circuit 54; a second driver circuit 55; a third driver circuit 56; a fourth driver circuit 57; a switch 58; and a control circuit 59.

This CCD has a three level electrode structure, in accordance with the teaching of the aforementioned patent application by Erb.

The electrodes of the CCD of FIG. 4 define a serial array of corresponding gates in the insulating dielectric layer 53 extending from the region adjacent the source 51 to the region adjacent the drain 52. Alternate electrodes are transfer electrodes T1, T2, T1', T2', T1" . . . and storage electrodes S1, S2, S1', S2' . . . , respectively.

The first driver circuit 54 is connected to a series of first transfer electrodes T1, T1', T1" . . . consisting of every other transfer electrode beginning with the first transfer electrodes T1 in the serial array closest to the source 51, for placing a first control signal ϕ1 on the first transfer gates $G_{T1}$, $G_{T1'}$, . . . to condition their corresponding semiconductor substrate regions for enabling charge packets to be transferred in the substrate 50 between those regions beneath the gates corresponding to the adjacent storage electrodes when the first control signal is of at least a transfer potential $V_T$.

The second driver circuit 55 is connected to a series of first storage electrodes S1, S1' . . . consisting of every other storage electrode beginning with the second electrode S1 in the serial array, for placing a second control signal ϕ2 on the first storage gates $G_{S1}$, $G_{S2'}$, . . . to condition their corresponding first semiconductor substrate regions for enabling charge packets to be stored in the substrate regions beneath the first storage gates when the second control signal is of at least a storage potential $V_S$.

The third driver circuit 56 is connected to a series of second transfer electrodes T2, T2' . . . consisting of every other transfer electrode beginning with the third electrode T2 in the serial array, for placing a third control signal ϕ3 on the second transfer gates $G_{T2}$, $G_{T2'}$ . . . to condition their corresponding semiconductor substrate regions for enabling charge packets to be transferred in the substrate 50 between those regions beneath the gates corresponding to the adjacent storage electrodes when the third control signal is of at least the transfer potential $V_T$.

The fourth driver circuit 57 is connected to a series of second storage electrodes S2, S2' . . . consisting of every other storage electrode beginning with the fourth electrode S2 in the serial array, for placing a fourth control signal ϕ4 on the second storage gates $G_{S2}$, $G_{S2'}$ . . . to condition their corresponding semiconductor substrate regions for enabling charge packets to be stored in the substrate regions beneath the second storage gates when the fourth control signal is of at least the storage potential $V_S$.

The electrodes T1, S1, T2, S2 ... are so disposed in the oxide that the transfer potential $V_T$ is less than the storage potential $V_S$.

The switch 58 is adapted for connecting the first storage electrodes S1, S1' ... to the second storage electrodes S2, S2' ...

Figure 5A:
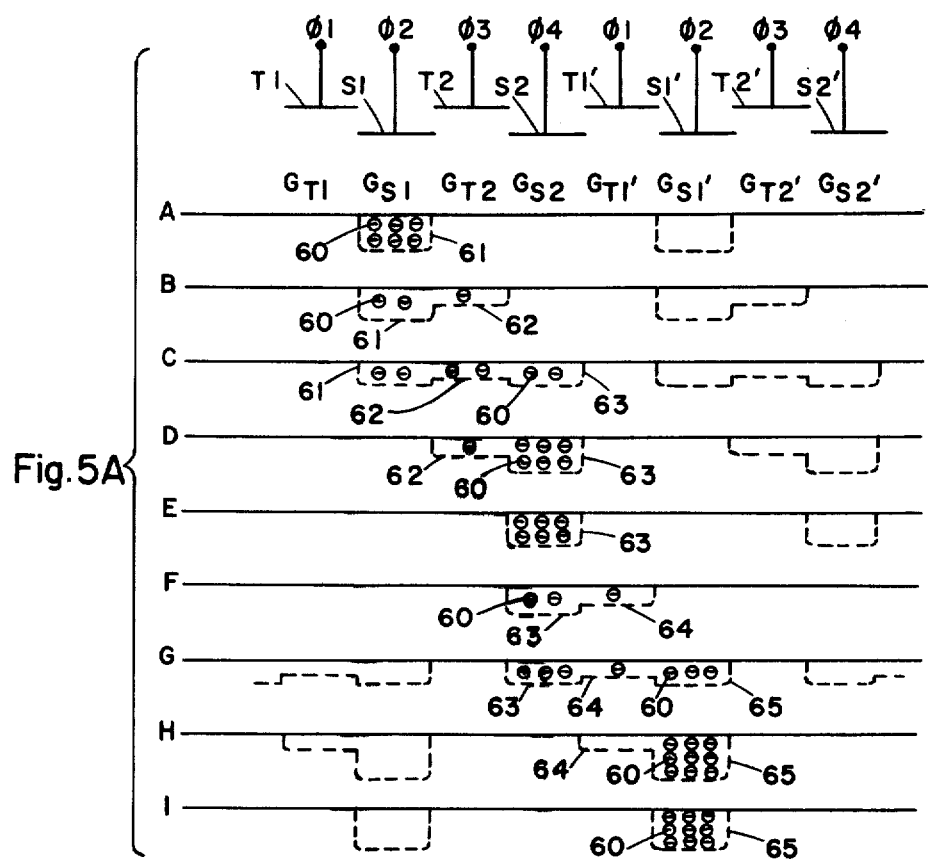
FIG. 5A shows the transfer of charge packets in the four-phase CCD of FIG. 4 during different intervals of the charge transfer operation.
Figure 5B:
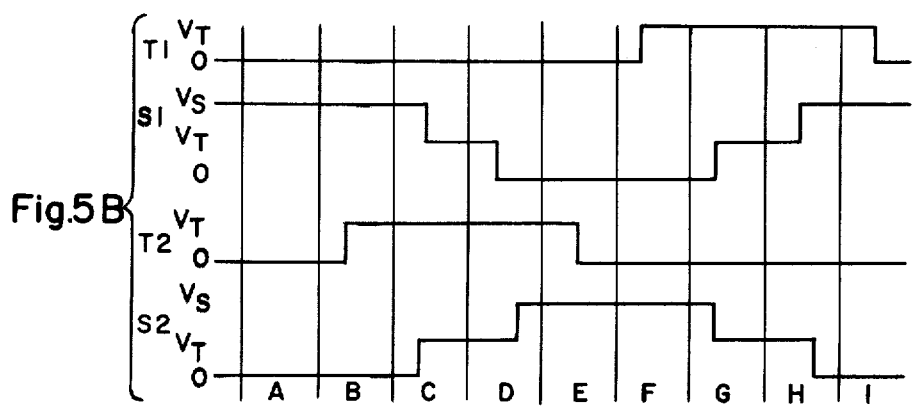
FIG. 5B shows the potential at the various electrodes of the CCD of FIG. 4 during the different transfer intervals.

The control circuit 59 is connected to the driver circuits 54, 55, 56, 57 and to the switch 58 for controlling the transfer of charge within the CCD of FIG. 4. The sequence of such control during successive intervals is described with reference to FIGS. 5A and 5B.

During a first interval "A", the control circuit 59 causes the first control signal $\phi 1$ at the first transfer electrodes T1, T1' to be at a rest potential "0"; the second control signal $\phi 2$ at the first storage electrodes S1, S1' to be at the storage potential $V_S$; the third control signal $\phi 3$ at the second transfer electrodes T2, T2' to be at a rest potential; and the fourth control signal $\phi 4$ at the second storage electrodes S2, S2' to be at a rest potential. During this first interval a charge packet 60 is stored in the potential well region 61 beneath the first storage gate $G_{S1}$.

During the next interval "B", the control circuit 59 causes the third control signal $\phi 3$ at the second transfer electrodes T2, T2' to rise to the transfer potential $V_T$, whereby a portion of the charge packet 60 stored in the region 61 beneath the first storage gate $G_{S1}$ is transferred to the region 62 beneath the adjacent second transfer gate $G_{T2}$.

During the next interval "C", the control circuit 59 causes the switch 58 to connect the first storage electrodes S1, S1' ... to the second storage electrodes S2, S2' ... to provide the transfer potential $V_T$ at the first storage electrodes S1, S1' ... and at the second storage electrodes S2, S2' ... whereby a portion of the chargepacket 60 stored beneath the first storage gate $G_{S1}$ is transferred through the region 62 beneath the adjacent first electrode $G_{T2}$ to the region 63 beneath the adjacent second storage gate $G_{S2}$.

During the fourth interval "D", the control circuit 59 causes the first control signal $\phi 1$ at the first transfer electrodes T1, T1' to remain at rest potential; causes the switch 58 to disconnect the first storage electrodes S1, S1' ... from the second storage electrodes S2, S2' ...; causes the second control signal $\phi 2$ at the first storage electrodes S1, S1' to be at a rest potential; causes the third control signal $\phi 3$ at the second transfer electrodes T2, T2' to remain at the transfer potential $V_T$, and causes the fourth control signal $\phi 4$ at the second storage electrodes S2, S2' to rise to the storage potential $V_S$, whereby the remaining charge in the charge packet 60 is transferred to the region 63 beneath the second storage gate $G_{S2}$ and the region 62 beneath adjacent second transfer gate $G_{T2}$.

During the fifth interval "E", the control circuit 59 causes the third control signal $\phi 3$ at the second transfer electrodes T2, T2' to return to rest potential, and the fourth control signal $\phi 4$ at the second storage electrodes S2, S2' to remain at storage potential $V_S$ to complete the transfer and store the charge packet 60 in the potential well region 63 beneath the second storage gate $G_{S2}$.

During the sixth interval "F", the control circuit 59 causes the first control signal $\phi 1$ at the first transfer electrodes T1, T1' to rise to the transfer potential $V_T$, whereby a portion of the charge packet 60 stored in the region 63 beneath the second storage gate $G_{S2}$ is transferred to the region 64 beneath the adjacent first transfer gate $G_{T1'}$.

During the next interval "G", the control circuit 59 causes the switch 58 to connect the second storage electrodes S2, S2' ... to the first storage electrodes S1, S1' ... to provide the transfer potential $V_T$ at the second storage electrodes S2, S2' ... and at the first storage electrodes S1, S1' ... whereby a portion of the charge packet 60 stored in the region 63 beneath the second storage gate $G_{S2}$ is transferred through the region 64 beneath the adjacent first storage electrode $G_{T1'}$ to the region 65 beneath the adjacent first storage gate $G_{S1'}$.

During the eighth interval "H", the control circuit 59 causes the switch 58 to disconnect the second storage electrodes S2, S2' ... from the first storage electrodes S1, S1' ...; causes the first control signal $\phi 1$ at the first transfer electrodes T1, T1' to remain at the transfer potential $V_T$; causes the second control signal $\phi 2$ at the first storage electrodes S1, S1' to rise to the storage potential $V_S$; causes the third control signal $\phi 3$ at the second transfer electrodes T2, T2' to remain at rest potential, and causes the fourth control signal $\phi 4$ at the second storage electrodes S2, S2' to return to the rest potential, whereby the remaining charge in the charge packet 60 is transferred to the region 65 beneath the first storage gate $G_{S1'}$ and the region 64 beneath the adjacent first transfer gate $G_{T1'}$.

During the ninth interval "I", the control circuit 59 causes the first control signal $\phi 1$ at the first transfer electrodes T1, T1' to return to rest potential, and the second control signal $\phi 2$ at the first storage electrodes S1, S1' to remain at the storage potential $V_S$ to complete the transfer and store the charge packet 60 in the potential well region 65 beneath the adjacent first storage gate $G_{S1'}$.

During the succession of nine intervals described above, a charge packet 60 is transferred from the region 61 beneath the first storage gate $G_{S1}$ to the region 63 beneath the second storage gate $G_2$, and then to the region 65 beneath the adjacent first storage gate $G_{S1'}$ in the direction away from the source 51.

In summary, the control circuit 59 and the switch 58 are connected to the driver circuits 54, 55, 56, 57 for connecting the first storage electrodes S1, S1' to the second storage electrodes S2, S2' when the first storage gates $G_{S1}$, $G_{S1'}$ are at the storage potential and the second transfer gates $G_{T2}$, $G_{T2'}$ are at the transfer potential to provide the transfer potential at the second storage gates $G_{S2}$, $G_{S2'}$, whereby a portion of a charge packet 60 stored in the region 61 beneath the first storage gate $G_{S1}$ is transferred through the region 62 beneath the adjacent second transfer gate $G_{T2}$ to the region 63 beneath the adjacent second storage gate $G_{S2}$; and for then disconnecting the first storage electrodes S1, S1' from the second storage electrodes S2, S2', and causing the first storage gates $G_{S1}$, $G_{S1'}$ to be at a rest potential while the second storage gates $G_{S2}$, $G_{S2'}$ are at the storage potential, whereby the charge packet 60 is stored in the region 63 beneath the second storage gate $G_{S2}$; and for subsequently causing the second transfer gates $G_{T2}$, $G_{T2'}$ to be at rest potential; and for connecting the second storage electrodes S2, S2' to the first storage electrodes S1, S1' when the second storage gates $G_{S2}$, $G_{S2'}$ are at the storage potential and the first transfer gates $G_{T1}$, $G_{T1}'$ are at the transfer potential to provide the transfer potential at the first storage gates $G_{S1}$, $G_{S1}'$, whereby a portion of the charge packet 60 stored in the region 63 beneath the second storage gate $G_{S2}$ is transferred through the region 64 beneath the adjacent first transfer gate $G_{T1}'$ to the region 65 beneath the adjacent first storage gate $G_{S1}'$ and for then disconnecting the second storage electrodes S2, S2' from the first storage electrodes S1, S1'; and causing the second storage gates $G_{S2}$, $G_{S2}'$ to be at rest potential while the first storage gates $G_{S1}$, $G_{S1}'$ are at the storage potential, whereby the charge packet 60 is stored in the region 65 beneath the first storage gate $G_{S1}'$ and for subsequently causing the first transfer gates $G_{T1}$, $G_{T1}'$ to be at rest potential.

Figure 6:
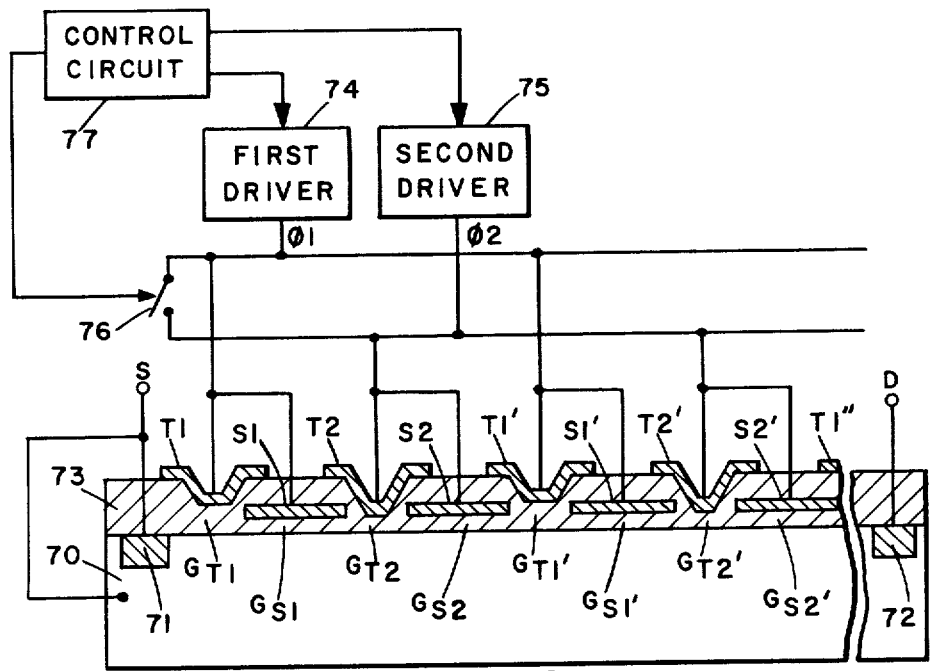
FIG. 6 is a partial block and schematic diagram of a two-phase tied-electrode CCD according to the present invention.

Referring to FIG. 6, a two-phase tied-electrode CCD according to the present invention includes a semiconductor substrate 70; a source diffusion 71 in the substrate 70; a drain diffusion 72 in the substrate 70; an insulating dielectric layer 73 covering the substrate 70; a serial array of electrodes T1, S1, T2, S2, S1', T2', S2', T1" . . . within the insulating dielectric layer 73; a first driver circuit 74; a second driver circuit 75; a switch 76; and a control circuit 77.

This CCD has a three level electrode structure, in accordance with the teaching of the aforementioned patent application by Erb.

The electrodes of the CCD of FIG. 6 define a serial array of corresponding gates in the insulating dielectric layer 73 extending from the region adjacent the source 71 to the region adjacent the drain 72. Alternate electrodes are transfer electrodes T1, T2, T1', T2', T1" . . . and storage electrodes S1, S2, S1', S2' . . . , respectively.

The first driver circuit is connected to both a series of first transfer electrodes T1, T1' consisting of every other transfer electrode beginning with the first transfer electrode T1 in the serial array, and a series of first storage electrodes S1, S1' consisting of every other storage electrode beginning with the second electrode S1 in the serial array, for placing a first control signal $\phi1$ on the corresponding first transfer gates $G_{T1}$, $G_{T1}'$ and the first storage gates $G_{S1}$, $G_{S1}'$ to condition their corresponding semiconductor substrate regions for enabling charge packets to be transferred in the substrate between those regions beneath the gates corresponding to the adjacent storage electrodes when the first control signal $\phi1$ is of at least a transfer potential $V_T$, and for enabling charge packets to be stored in the substrate regions beneath the first storage gates $G_{S1}$, $G_{S1}'$ when the first control signal $\phi1$ is of at least a storage potential $V_S$.

The second driver circuit is connected to both a series of second transfer electrodes T2, T2' consisting of every other transfer electrode beginning with the third electrode T2 in the serial array, and a series of second storage electrodes S2, S2' consisting of every other storage electrode beginning with the fourth electrode S2 in the serial array, for placing a second control signal $\phi2$ on the corresponding second transfer gates $G_{T2}$, $G_{T2}'$ and second storage gates $G_{S2}$, $G_{S2}'$ to condition their corresponding semiconductor substrate regions for enabling charge packets to be transferred in the substrate between those regions beneath the gates corresponding to the adjacent storage electrodes when the second control signal $\phi2$ is of at least a transfer potential $V_T$, and for enabling charge packets to be stored in the substrate regions beneath the second storage gates when the second control signal $\phi2$ is of at least a storage potential $V_S$.

The electrodes are so disposed in the dielectric layer 73 that the transfer potential $V_T$ is less than the storage potential $V_S$.

The switch 76 is adapted for connecting the first transfer and storage electrodes T1, T1', S1, S1' to the second transfer and storage electrodes T2, T2', S2, S2'.

Figure 7A:
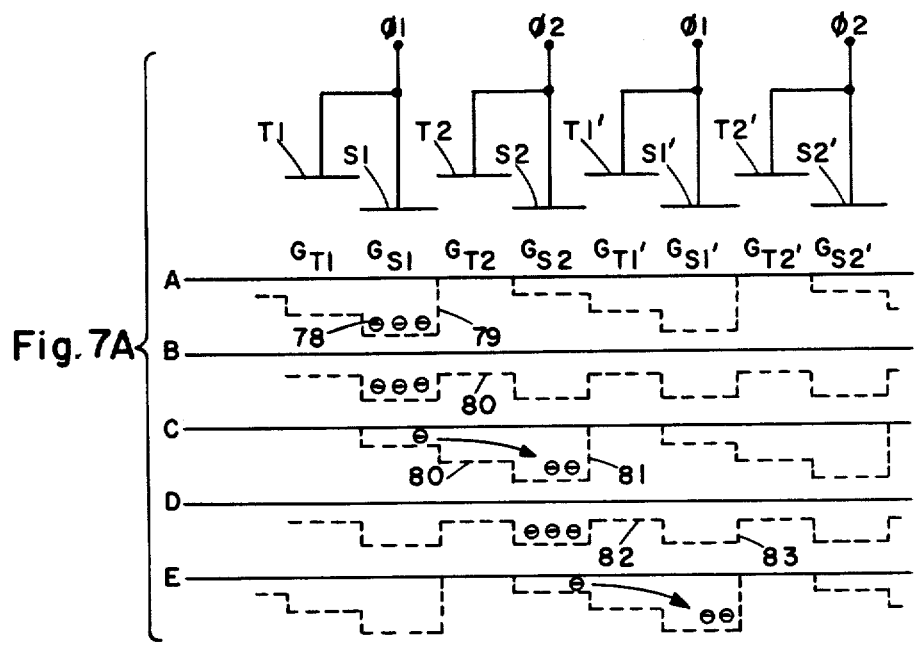
FIG. 7A shows the transfer of charge packets in the CCD of FIG. 6 during different intervals of the charge transfer operation.
Figure 7B:
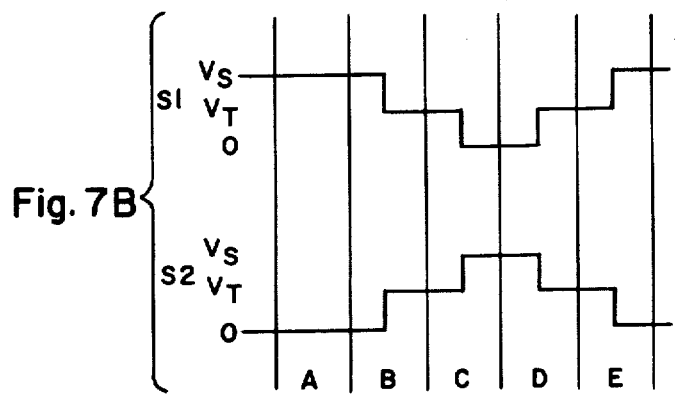
FIG. 7B shows the potential at the various electrodes of the CCD of FIG. 6 during the different transfer intervals.

A control circuit 77 is connected to the driver circuits 74, 75 and to the switch 76 for controlling the transfer of charge within the CCD of FIG. 6. The sequence of such control during successive intervals is described with reference to FIGS. 7A and 7B.

During a first interval "A", the control circuit 77 causes a first control signal $\phi1$ at the first transfer electrodes T1, T1' and the first storage electrodes S1, S1' to be at a storage potential $V_S$; and the second control signal $\phi2$ at the second transfer electrodes T2, T2' and the second storage electrodes S2, S2' to be at a rest potential. During this first interval a charge packet 78 is stored in a potential well 79 beneath the first storage gate $G_{S1}$.

During the next interval "B", the control circuit 77 causes the switch 76 to connect the first storage electrodes S1, S1' and the first transfer electrodes T1, T1' to the second storage electrodes S2, S2' and the second transfer electrodes T1, T1' to thereby provide the transfer potential $V_T$ at all of the electrodes.

During the third interval "C", the control circuit 77 causes the switch 76 to disconnect the first storage electrodes S1, S1' and the first transfer electrodes T1, T1' from the second storage electrodes S2, S2' and the second transfer electrodes T2, T2'; causes the control signal $\phi2$ on the second storage electrodes S2, S2' to rise to the storage potential $V_S$; and causes the control signal $\phi1$ on the first storage electrodes S1, S1' to fall to a rest potential. As a result, a charge packet 78 stored in the region 79 beneath the first storage gate $G_{S1}$ is transferred through the region 80 beneath the adjacent second transfer gate $G_{T2}$ and stored in the region 81 beneath the second storage gate $G_{S2}$.

During the fourth interval "D", the control circuit 77 causes the switch 76 to connect the first storage electrodes S1, S1' and the first transfer electrodes T1, T1' to the second storage electrodes S2, S2' and the second transfer electrodes T1, T1' to again provide the transfer potential $V_T$ at all of the electrodes.

During the fifth interval "E", the control circuit 77 causes the switch 76 to disconnect the first storage electrodes S1, S1' and the first transfer electrodes T1, T1' from the second storage electrodes S2, S2' and the second transfer electrodes T1, T2'; causes the control signal $\phi1$ on the first storage electrodes S1, S1' to rise to the storage potential $V_S$; and causes the control signal $\phi2$ on the second storage electrodes S2, S2' to fall to a rest potential. As a result, a charge packet 78 stored in the region 82 beneath the second storage gate $G_{S2}$ is transferred through the region 82 beneath the adjacent first transfer gate $G_{T1}'$ and stored in the region 83 beneath the adjacent first storage gate $G_{S1}''$.

During the succession of five intervals described above, a charge packet 78 is transferred from the region 79 beneath the first storage gate $G_{S1}$ to the region 81 beneath the second storage gate $G_{S2}$, and then to the region 83 beneath the adjacent first storage gate $G_{S1}'$ in the direction away from the source 71.

In summary, the control circuit 77 and the switch 76 are connected to the driver circuits 74, 75 for connecting the first transfer and storage electrodes T1, T1', S1, S1' to the second transfer and storage electrodes T2, T2', S2, S2' when the first storage gates $G_{S1}$, $G_{S1}'$ are at the storage potential to provide the transfer potential at the second transfer gates $G_{T2}$, $G_{T2}'$ and for then disconnecting the first transfer and storage electrodes T1, T1', S1, S1' from the second transfer and storage electrodes T2, T2', S2, S2', and causing the first storage gates $G_{S1}$, $G_{S1}'$ to be at a rest potential while the second storage gates $G_{S2}$, $G_{S2}'$ are at the storage potential, whereby the charge packet 78 stored in the region 79 beneath the first storage gate is transferred through the region 80 beneath the adjacent second transfer gate $G_{T2}$ and stored in the region 81 beneath the adjacent second storage gate $G_{S2}$; and for connecting the second transfer and storage electrodes T2, T2', S2, S2' to the first transfer and storage electrodes T1, T1', S1, S1' when the second storage gates $G_{S2}$, $G_{S2}'$ are at the storage potential to provide the transfer potential at the first transfer gates $G_{T1}$, $G_{T1}'$; and for then disconnecting the second transfer and storage electrodes T2, T2', S2, S2' from the first transfer and storage electrodes T1, T1', S1, S1', and causing the second storage gates $G_{S2}$, $G_{S2}'$ to be at rest potential while the first storage gates $G_{S1}$, $G_{S1}'$ are at the storage potential, whereby the charge packet 78 stored in the region 81 beneath the second storage gate $G_{S2}$ is transferred through the region 82 beneath the adjacent first transfer gate $G_{T1}'$ and stored in the region 83 beneath the adjacent first storage gate $G_{S1}'$.

Figure 8:
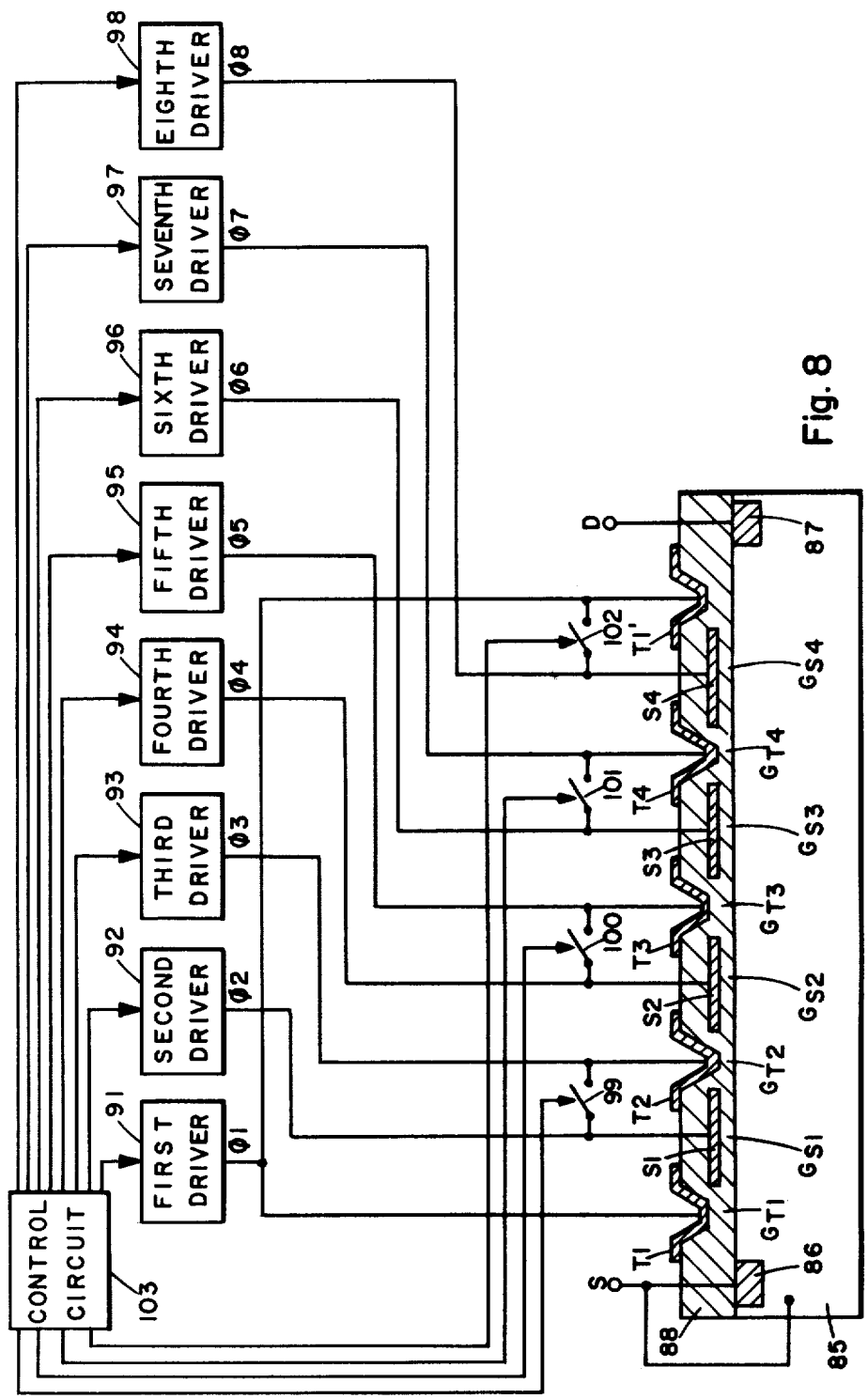
FIG. 8 is a partial block and schematic diagram of a ripple-clocked CCD according to the present invention.

Referring to FIG. 8, a ripple-clocked CCD according to the present invention for storing 3 bits of data includes a semiconductor substrate 85; a source diffusion 86 in the substrate 85; a drain diffusion 87 in the substrate 85; an insulating dielectric layer 88 covering the substrate 85; a serial array of electrodes T1, S1, T2, S2, T3, S3, T4, S4, T1' within the insulating dielectric layer 88; a first driver circuit 91; a second driver circuit 92; a third driver circuit 93; a fourth driver circuit 94; a fifth driver circuit 95; a sixth driver circuit 96; a seventh driver circuit 97; an eighth driver circuit 98; a first switch 99; a second switch 100; a third switch 101; a fourth switch 102; and a control circuit 103.

This CCD has a three level electrode structure, in accordance with the teaching of the aforementioned patent application by Erb.

The electrodes of the CCD of FIG. 8 define a serial array of corresponding gates in the insulating dielectric layer 88 beginning with a transfer electrode and extending from the region adjacent the source 86 to the region adjacent the drain 87. Alternate electrodes are transfer electrodes T1, T2, T3, T4, T1', and storage electrodes S1, S2, S3, S4, respectively.

There are four transfer gate driver circuits 91, 93, 95, 97. Each is connected to one of the transfer electrodes T1, T2, T3, T4 for placing a first control signal $\phi1$, $\phi3$, $\phi5$, $\phi7$ respectively on its corresponding transfer gate $G_{T1}$, $G_{T2}$, $G_{T3}$, $G_{T4}$ to condition its corresponding semiconductor substrate region for enabling a charge packet representing a data bit to be transferred in the substrate 85 between those regions beneath the gates corresponding to the adjacent storage electrodes when the respective first control signal $\phi1$, $\phi3$, $\phi5$, $\phi7$ is of at least a transfer potential $V_T$.

There also are four storage gate driver circuits 92, 94, 96, 98. Each is connected to one of the storage electrodes S1, S2, S3, S4 for placing a second control signal $\phi2$, $\phi4$, $\phi6$, $\phi8$ on its corresponding storage gate $G_{S1}$, $G_{S2}$, $G_{S3}$, $G_{S4}$ to condition its corresponding semiconductor substrate region for enabling a charge packet representing a data bit to be stored in such substrate region when the respective second control signal $\phi2$, $\phi4$, $\phi6$, $\phi8$ is of at least a storage potential $V_S$.

The electrodes T1, S1, T2, S2, T3, S3, T4, S4, T1' are so disposed in the dielectric insulating layer that the transfer potential $V_T$ is less than the storage potential $V_S$.

The first switch 99 is adapted for connecting the first storage electrode S1 to the second transfer electrode T2. The second switch 100 is adapted for connecting the second storage electrode S2 to the third transfer electrode T3. The third switch 101 is adapted for connecting the third storage electrode S3 to the fourth transfer electrode T4. The fourth switch 102 is adapted for connecting the fourth storage electrode S4 to the first transfer electrodes T1, T1'.

Figure 9A:
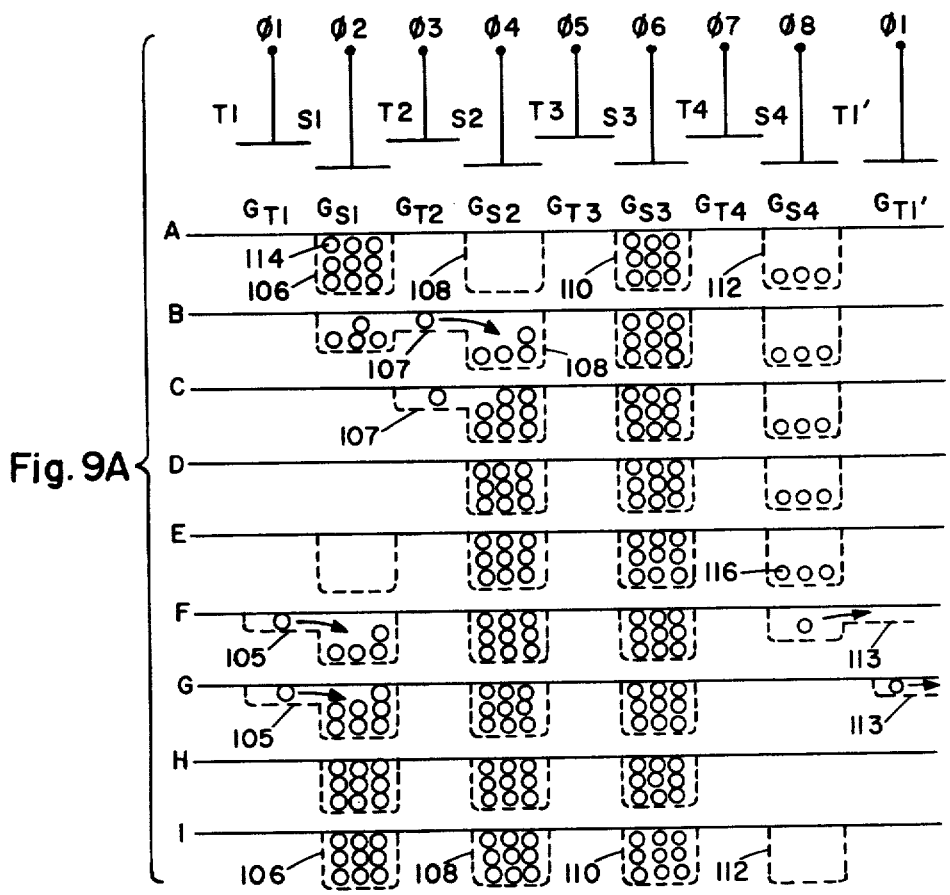
FIG. 9A shows the transfer of charge packets in the ripple-clocked CCD of FIG. 8 during different intervals of the charge transfer operation.
Figure 9B:
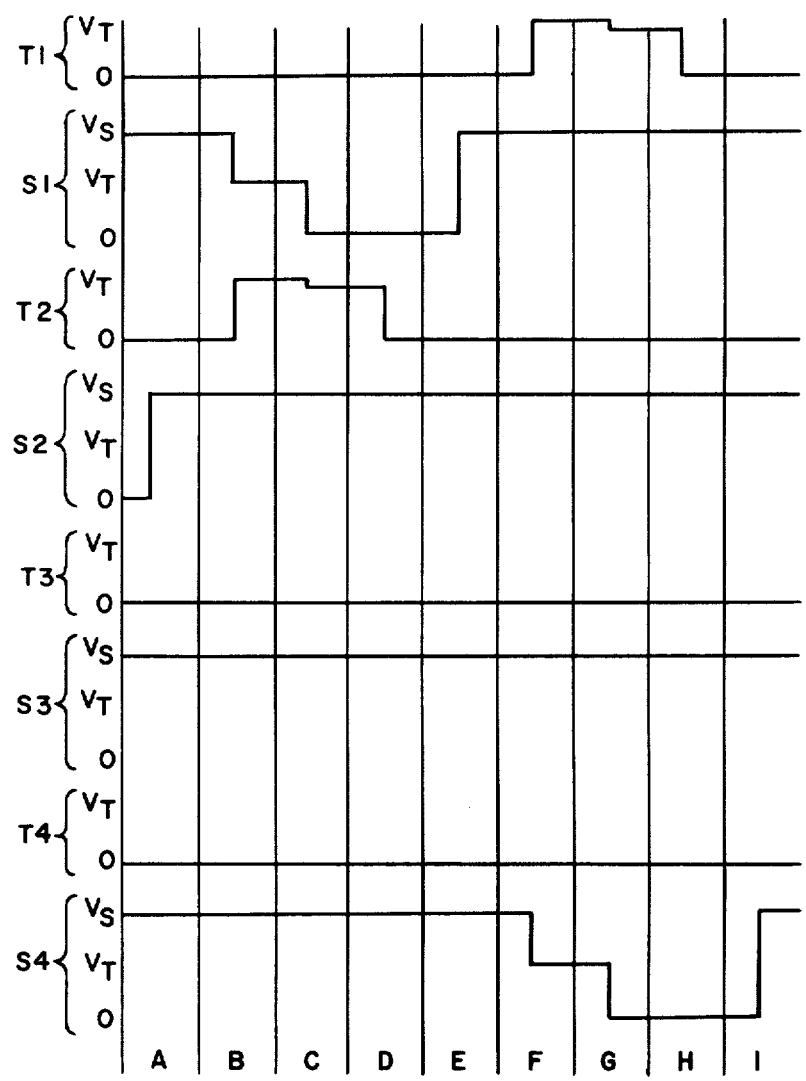
FIG. 9B shows the potential at the various electrodes of the CCD of FIG. 8 during the different transfer intervals.

The control circuit 103 is connected to the driver circuits 91, 92, 93, 94, 95, 96, 97, 98, and to the switches 99, 100, 101, 102 for controlling the transfer of charge within the CCD of FIG. 8. The sequence of such control during successive intervals is described with reference to FIGS. 9A and 9B.

During a first interval A, three bits of data are stored in the four semiconductor substrate potential well regions 106, 108, 110 and 112 beneath their corresponding gates $G_{S1}$, $G_{S2}$, $G_{S3}$ and $G_{S4}$. Charge packets representing a "one" data bit are stored in regions 106 and 110. A charge packet representing a "zero" data bit is stored in region 112. Region 108 is empty. During the "A" interval the control circuit 103 causes the first control signal $\phi1$ at the first transfer electrode T1 to be at rest potential; the second control signal $\phi2$ at the first storage electrode to be at the storage potential $V_S$; the third control signal $\phi3$ at the second transfer electrode T2 to be at rest potential; the fourth control signal $\phi4$ at the second storage electrode S2 to rise from its rest potential to the storage potential $V_S$ to create a potential well in the region 108 beneath the second storage gate $G_{S2}$; the fifth control signal $\phi5$ at the third transfer electrode T3 to be at rest potential; the sixth control signal $\phi6$ at the third storage electrode S3 to be at the storage potential $V_S$; the seventh control signal $\phi7$ at the fourth transfer electrode T4 to be at rest potential; and the eighth control signal $\phi8$ at the fourth storage electrode S4 to be at the storage potential $V_S$.

During the second interval "B", the control circuit 103 causes the switch 99 to connect the second transfer electrode T2 to the first storage electrode S1 to place the transfer potential $V_T$ on the second transfer gate $G_{T2}$, whereby a portion of a charge packet 114 stored in the region 106 beneath the first storage gate $G_{S1}$ is transferred through the region 107 beneath the second transfer gate $G_{T2}$ to the region 108 beneath the second storage gate $G_{S2}$.

During the third interval "C", the control circuit 103 causes the switch 99 to disconnect the second transfer electrode T2 from the first storage electrode S2, and further causes the second control signal $\phi2$ at the first storage electrode S2 to go to rest potential, and the third control signal $\phi3$ at the second transfer electrode to be at the transfer potential $V_T$, whereby the remaining charge in the charge packet 114 is stored in the region 108 beneath the second storage gate $G_{S2}$.

During the fourth interval "D", the control circuit 103 causes the third control signal $\phi3$ at the second transfer electrode T2 to return to rest potential.

During the fifth interval "E", the control circuit 103 causes the second control signal $\phi_2$ at the first storage electrode S1 to rise to the storage potential $V_S$ to create a potential well in the region 106 beneath the first storage gate $G_{S1}$.

During the sixth interval "F", the control circuit 103 causes the switch 102 to connect the first transfer electrodes T1 and T1' to the fourth storage electrode S4 to place the transfer potential $V_T$ on the first transfer gates $G_{T1}$ and $G_{T1}'$. This results in a portion of the charge packet 116 stored in the region 112 beneath the fourth storage gate $G_{S4}$ being transferred through the region 113 beneath the first transfer $G_{T1}'$ to the drain 87; and also results in a portion of a charge packet stored in the source 86 being transferred through the region 105 beneath the first transfer gate $G_{T1}$ to the region 106 beneath the first storage gate $G_{S1}$.

During the seventh interval "G", the control circuit 103 causes the switch 102 to disconnect the first transfer electrodes T1 and T1' from the fourth storage electrode S4, and further causes the eighth control signal $\phi_8$ at the fourth storage electrode to go to rest potential, and the first control signal $\phi_1$ at the first transfer electrodes T1, T1' to remain at the transfer potential $V_T$, whereby the remaining charge in the charge packet 116 is stored in the drain 87, and the remaining charge in the charge packet from the source 86 is stored in the region 106 beneath the first storage gate $G_{S1}$. The charge packet stored in the region 106 during the interval "G" represents a "one" data bit.

During the eighth interval "H", the control circuit 103 causes the first control signal $\phi_1$ at the first transfer electrodes T1, T1' to return to rest potential.

During the ninth interval "I", the control circuit 103 causes the eighth control signal $\phi_8$ at the fourth storage electrode S4 to rise to the storage potential $V_S$ to create a potential well in the region 112 beneath the fourth storage gate $G_{S4}$.

It is readily seen that as the sequence is continued, with the fourth transfer electrode T4 being connected to the third storage electrode S3 by the third switch 101, transfer of the charge packet in the region 110 to the region 112 will be initiated. And four intervals later, when the second switch 100 connects the third transfer electrode T3 to the second storage electrode S2, transfer of the charge packet in the region 108 to the region 110 is likewise initiated.

In summary, the control circuit 103 and the switches 99, 100, 101 and 103 are connected to the driver circuits 91–98 for connecting the xth storage electrode in the serial array to the (x+1)th transfer electrode in the serial array when x=1,2 ..., or n and there are n charge packets stored in the regions beneath n of the n+1 storage gates and no charge packet is stored in the region beneath the (x+1)th storage gate to provide the transfer potential at the (x+1)th transfer gate, whereby a portion of a charge packet stored in the region beneath the xth storage gate is transferred through the region beneath the (x+1)th transfer gate to the region beneath the (x+1)th storage gate; and for then disconnecting the xth storage electrode from the (x+1)th transfer electrode, and causing the xth storage gate to be at a rest potential while the (x+1)th storage gate is at the storage potential, whereby the charge packet is stored in the region beneath the (x+1)th storage gate; and for connecting the (n+1)th storage electrode in the serial array to the first transfer electrode in the serial array when there are n charge packets stored in the regions beneath n of the n+1 storage gates and no charge packet is stored in the region beneath the first storage gate in the serial array to provide the transfer potential at the first transfer gate, whereby a portion of a charge packet is transferred through the region beneath the first transfer gate to the region beneath the first storage gate; and for then disconnecting the (n+1)th storage electrode from the first transfer electrode, and causing the (n+1)th storage gate to be at rest potential while the first storage gate is at the storage potential, whereby the charge packet is stored in the region beneath the first storage gate.

The ripple-clocked CCD of FIG. 8 is useful in a parallel register section of a series-parallel-series CCD or in a multiplexed channel CCD.

I claim:

1. A charge-coupled device comprising
a semiconductor substrate;
an insulative dielectric layer covering the substrate;
a serial array of electrodes defining a serial array of corresponding gates in the dielectric layer; wherein alternate electrodes are transfer electrodes and storage electrodes respectively;
a plurality of transfer gate driver circuits connected to the transfer electrodes for selectively placing first control signals on their corresponding transfer gates to condition their respective corresponding semiconductor substrate regions for enabling a charge packet to be transferred in the substrate between those regions beneath the gates corresponding to the adjacent storage electrodes when the first control signal placed on the intervening transfer gate is of at least a transfer potential; and
a plurality of storage gate driver circuits connected to the storage electrodes for selectively placing second control signals on their corresponding storage gates to condition their respective corresponding semiconductor substrate regions for enabling a charge packet to be stored in selected substrate regions when the second control signal is of at least a storage potential;
wherein the improvement comprises;
circuit means connected to the driver circuits for connecting a given storage electrode in the serial array corresponding to the substrate region from which a charge packet is to be transferred to an adjacent electrode corresponding to an uncharged substrate region to initiate transfer of the charge packet from the substrate region corresponding to the given storage electrode.

2. A charge-coupled device according to claim 1, wherein
the driver circuits comprise
a first driver circuit connected to a series of first transfer electrodes consisting of every other transfer electrode beginning with the first electrode in the serial array for placing a first control signal on their corresponding first transfer gates to condition their corresponding semiconductor substrate regions for enabling charge packets to be transferred in the substrate between those regions beneath the gates corresponding to the adjacent storage electrodes when the first control signal is of at least a transfer potential;
a second driver circuit connected to a series of first storage electrodes consisting of every other storage electrode beginning with the second electrode in the serial array, for placing a second control signal on their corresponding first storage gates to condition their corresponding semiconductor substrate regions for enabling charge packets to be stored in the substrate regions beneath the first storage gates when the second control signal is of at least a storage potential;

a third driver circuit connected to a series of second transfer electrodes consisting of every other transfer electrode beginning with the third electrode in the serial array, for placing a third control signal on their corresponding second transfer gates to condition their corresponding semiconductor substrate regions for enabling charge packets to be transferred in the substrate between those regions beneath the gates corresponding to the adjacent storage electrodes when the third control signal is of at least a transfer potential; and a fourth driver circuit connected to a series of second storage electrodes consisting of every other storage electrode beginning with the fourth electrode in the serial array, for placing a fourth control signal on their corresponding second storage gates to condition their corresponding semiconductor substrate regions for enabling charge packets to be stored in the substrate regions beneath the second storage gates when the fourth control signal is of at least a storage potential; and the electrodes are so disposed in the dielectric layer that the transfer potential is less than the storage potential;

wherein the improvement comprises the circuit means being connected to the driver circuits for connecting the first storage electrodes to the second transfer electrodes when the first storage gates are at the storage potential to provide the transfer potential at the second transfer gates, whereby a portion of a charge packet stored in the region beneath the first storage gate is transferred through the region beneath the adjacent second transfer gate to the region beneath the adjacent second storage gate; and for then disconnecting the first storage electrodes from the second transfer electrodes, and causing the first storage gates to be at a rest potential while the second storage gates are at the storage potential, whereby the charge packet is stored in the region beneath the second storage gate; and for connecting the second storage electrodes to the first transfer electrodes when the second storage gates are at the storage potential to provide the transfer potential at the first transfer gates, whereby a portion of a charge packet stored in the region beneath the second storage gate is transferred through the region beneath the adjacent first transfer gate to the region beneath the adjacent first storage gate; and for then disconnecting the second storage electrodes from the first transfer electrodes, and causing the second storage gates to be at rest potential while the first storage gates are at the storage potential, whereby the charge packet is stored in the region beneath the first storage gate adjacent the adjacent first transfer gate.

3. A charge-coupled device according to claim 1, wherein the driver circuits comprise a first driver circuit connected to a series of first transfer electrodes consisting of every other transfer electrode beginning with the first electrode in the serial array, for placing a first control signal on their corresponding first transfer gates to condition their corresponding semiconductor substrate regions for enabling charge packets to be transferred in the substrate between those regions beneath the gates corresponding to the adjacent storage electrodes when the first control signal is of at least a transfer potential;

a second driver circuit connected to a series of first storage electrodes consisting of every other storage electrode beginning with the second electrode in the serial array, for placing a second control signal on their corresponding first storage gates to condition their corresponding semiconductor substrate regions for enabling charge packets to be stored in the substrate regions for enabling charge packets to be stored in the substrate regions beneath the first storage gates when the second control signal is of at least a storage potential;

a third driver circuit connected to a series of second transfer electrodes consisting of every other transfer electrode beginning with the third electrode in the serial array, for placing a third control signal on their corresponding second transfer gates to condition their corresponding semiconductor substrate regions enabling charge packets to be transferred in the substrate between those regions beneath the gates corresponding to the adjacent storage electrodes when the third control signal is of at least a transfer potential; and a fourth driver circuit connected to a series of second storage electrodes consisting of every other storage electrode beginning with the fourth electrode in the serial array, for placing a fourth control signal on their corresponding second storage gates to condition their corresponding semiconductor substrate regions for enabling charge packets to be stored in the substrate regions beneath the second storage gates when the fourth control signal is of at least a storage potential; and the electrodes are so disposed in the dielectric layer that the transfer potential is less than the storage potential;

wherein the improvement comprises the circuit means being connected to the driver circuits for connecting the first storage electrodes to the second storage electrodes when the first storage gates are at the storage potential and the second transfer gates are at the transfer potential to provide the transfer potential at the second storage gates, whereby a portion of a charge packet stored in the region beneath the first storage gate is transferred through the region beneath the adjacent second transfer gate to the region beneath the adjacent second storage gate; and for then disconnecting the first storage electrodes from the second storage electrodes, and causing the first storage gates to be at a rest potential while the second storage gates are at the storage potential, whereby the charge packet is stored in the region beneath the second storage gate; and for subsequently causing the second transfer gates to be at rest potential; and for connecting the second storage electrodes to the first storage electrodes when the second storage gates are at the storage potential and the first transfer gates are at the transfer potential to provide the transfer potential at the first storage gates, whereby a portion of a charge packet stored in the region beneath the second storage gate is transferred through the region beneath the adjacent first transfer gate to the region beneath the adjacent first storage gate; and for then disconnecting the second storage electrodes from the first storage electrodes; and causing the second storage gates to be at rest potential while the first storage gates are at the storage potential, whereby the charge packet is stored in the region beneath the first storage gate, and for subsequently causing the first transfer gates to be at rest potential.

4. A charge-coupled device according to claim 1, wherein the driver circuits comprise a first driver circuit connected to both a series of first transfer electrodes consisting of every other transfer electrode beginning with the first transfer electrode in the serial array, and a series of first storage electrodes consisting of every other storage electrode beginning with the second electrode in the serial array, for placing a first control signal on the corresponding first transfer gates and the first storage gates to condition their corresponding semiconductor substrate regions for enabling charge packets to be transferred in the substrate between those regions beneath the gates corresponding to the adjacent storage electrodes when the first control signal is of at least a transfer potential and for enabling charge packets to be stored in the substrate regions beneath the first storage gates when the first control signal is of at least a storage potential;

a second driver circuit connected to both a series of second transfer electrodes consisting of every other transfer electrode beginning with the third electrode in the serial array, and a series of second storage electrodes consisting of every other storage electrode beginning with the fourth electrode in the serial array for placing a second control signal on the corresponding second transfer gates and second storage gates to condition their corresponding semiconductor substrate regions for enabling charge packets to be transferred in the substrate between those regions beneath the gates corresponding to the adjacent storage electrodes when the second control signal is of at least a transfer potential; and for enabling charge packets to be stored in the substrate regions beneath the second storage gates when the second control signal is of at least a storage potential; and the electrodes are so disposed in the dielectric layer that the transfer potential is less than the storage potential;

wherein the improvement comprises the circuit means being connected to the driver circuits for connecting the first transfer and storage electrodes to the second transfer and storage electrodes when the first storage gates are at the storage potential to provide the transfer potential at the second transfer gates; and for then disconnecting the first transfer and storage electrodes from the second transfer and storage electrodes, and causing the first storage gates to be at a rest potential while the second storage gates are at the storage potential, whereby a charge packet stored in the region beneath the first storage gate is transferred through the region beneath the adjacent second transfer gate and stored in the region beneath the second storage gate; and for connecting the second transfer and storage electrodes to the first transfer and storage electrodes when the second storage gates are at the storage potential to provide the transfer potential at the first transfer gates; and for then disconnecting the second transfer and storage electrodes from the first transfer and storage electrodes, and causing the second storage gates to be at rest potential while the first storage gates are at the storage potential, whereby a charge packet stored in the region beneath the second storage gate is transferred through the region beneath the adjacent first transfer gate; and stored in the region beneath the first storage gate adjacent the adjacent first transfer gate.

5. A ripple-clocked charge-coupled device according to claim 1 for storing "n" bits of data, wherein the serial array includes $2(n+1)$ electrodes defining a serial array of corresponding gates in the dielectric layer; wherein alternate electrodes are transfer electrodes and storage electrodes respectively, beginning with a transfer electrode;

the driver circuits comprise $(n+1)$ transfer gate driver circuits, each being connected to one of the transfer electrodes for placing a first control signal on its corresponding transfer gate to condition its corresponding semiconductor substrate region for enabling a charge packet representing a data bit to be transferred in the substrate between those regions beneath the gates corresponding to the adjacent storage electrodes when the first control signal is of at least a transfer potential; and $(n+1)$ storage gate driver circuits each being connected to one of the storage electrodes for placing a second control signal on its corresponding storage gate to condition its corresponding semiconductor substrate region for enabling a charge packet representing a data bit to be stored in such substrate region when the second control signal is of at least a storage potential; and the electrodes are so disposed in the dielectric insulating layer that the transfer potential is less than the storage potential; and wherein the improvement comprises:

the circuit means being connected to the driver circuits for connecting the xth storage electrode in the serial array to the $(x+1)$th transfer electrode in the serial array when $x=1,2\ldots$, or n and there are n charge packets stored in the regions beneath n of the $n+1$ storage gates and no charge packet is stored in the region beneath the $(x+1)$th storage gate to provide the transfer potential at the $(x+1)$th transfer gate, whereby a portion of a charge packet stored in the region beneath the xth storage gate is transferred through the region beneath the $(x+1)$th transfer gate to the region beneath the $(x+1)$th storage gate; and for then disconnecting the xth storage electrode from the $(x+1)$th transfer electrode, and causing the xth storage gate to be at a rest potential while the $(x+1)$th storage gate is at the storage potential, whereby the charge packet is stored in the region beneath the $(x+1)$th storage gate; and for connecting the $(n+1)$th storage electrode in the serial array to the first transfer electrode in the serial array when there are n charge packets stored in the regions beneath n of the $n+1$ storage gates and no charge packet is stored in the region beneath the first storage gate in the serial array to provide the transfer potential at the first transfer gate, whereby a portion of a charge packet is transferred through the region beneath the first transfer gate to the region beneath the first storage gate; and for then disconnecting the (n+1)th storage electrode from the first transfer electrode, and causing the (n+1)th storage gate to be at rest potential while the first storage gate is at the storage potential, whereby the charge packet is stored in the region beneath the first storage gate.

* * * * *